(12) United States Patent
Bamberger et al.

(10) Patent No.: US 10,931,131 B2
(45) Date of Patent: Feb. 23, 2021

(54) METHOD AND APPARATUS FOR CHARGING OR DISCHARGING AN ENERGY STORE

(71) Applicant: Siemens Aktiengesellschaft, Munich (DE)

(72) Inventors: Joachim Bamberger, Munich (DE); Kurt Majewski, Munich (DE); Philipp Wolfrum, Munich (DE)

(73) Assignee: SIEMENS AKTIENGESELLSCHAFT

( * ) Notice: Subject to any disclaimer, the term of this patent is extended or adjusted under 35 U.S.C. 154(b) by 69 days.

(21) Appl. No.: 15/559,082

(22) PCT Filed: Mar. 15, 2016

(86) PCT No.: PCT/EP2016/055574
§ 371 (c)(1),
(2) Date: Sep. 18, 2017

(87) PCT Pub. No.: WO2016/150770
PCT Pub. Date: Sep. 29, 2016

(65) Prior Publication Data
US 2018/0076645 A1 Mar. 15, 2018

(30) Foreign Application Priority Data
Mar. 23, 2015 (DE) ...................... 10 2015 205 171.4

(51) Int. Cl.
*H02J 7/00* (2006.01)
*G01R 31/382* (2019.01)
(Continued)

(52) U.S. Cl.
CPC ......... *H02J 7/0069* (2020.01); *H02J 7/00711* (2020.01); *G01R 31/367* (2019.01); *G01R 31/382* (2019.01); *G01R 31/392* (2019.01)

(58) Field of Classification Search
CPC ...... H02J 7/0057; H02J 7/0075; H02J 7/0093; H02J 7/0063; H02J 2007/0067;
(Continued)

(56) References Cited

U.S. PATENT DOCUMENTS 7,928,735 B2 4/2011 Huang
2011/0127962 A1 6/2011 Murao et al.
(Continued)

FOREIGN PATENT DOCUMENTS

DE 102010010409 A1 * 9/2011 ............ H02J 7/0024
DE 102010010409 A1 9/2011
(Continued)

OTHER PUBLICATIONS

PCT International Search Report and Written Opinion of International Searching Authority dated Mar. 25, 2016 corresponding to PCT International Application No. PCT/EP2016/055574 filed Mar. 15, 2016.

(Continued)

*Primary Examiner* — Drew A Dunn
*Assistant Examiner* — Sailesh Thapa
(74) *Attorney, Agent, or Firm* — Schmeiser, Olsen & Watts LLP

(57) ABSTRACT

Provided is a method for charging or discharging an electrochemical energy store, the ageing behavior of which energy store is modelled by describing its depth of discharge at which a depth of discharge value is associated with each time period between two adjacent local maxima and minima in a time-dependent state of charge profile, which depth of discharge value corresponds to the charging or discharging stroke between the state of charge values of the two adjacent local maxima and minima.

12 Claims, 6 Drawing Sheets

(51) Int. Cl.
    *G01R 31/392* (2019.01)
    *G01R 31/367* (2019.01)

(58) Field of Classification Search
    CPC ...... H02J 7/0072; H02J 7/042; H02J 2007/10; H02J 7/125; H02J 7/0069; H02J 7/00711; G01R 31/392; G01R 31/382; G01R 31/367
    See application file for complete search history.

(56) References Cited

U.S. PATENT DOCUMENTS

| | | | |
|---|---|---|---|
| 2013/0026976 A1 | 1/2013 | Lu | |
| 2014/0239905 A1* | 8/2014 | Yamazaki | H01M 10/44 320/128 |
| 2015/0088253 A1* | 3/2015 | Doll | A61F 2/1624 623/6.22 |
| 2015/0355284 A1* | 12/2015 | Prada | G05B 13/042 700/297 |
| 2016/0149430 A1 | 5/2016 | Hempel et al. | |

FOREIGN PATENT DOCUMENTS

| | | |
|---|---|---|
| DE | 102013105119 A1 | 12/2014 |
| JP | H10243572 A | 9/1998 |
| WO | WO-2010076608 A1 * | 7/2010 ............ H02J 7/0075 |
| WO | WO 2010076608 A1 | 7/2010 |
| WO | WO 2013151728 A1 | 10/2013 |

OTHER PUBLICATIONS

Indian Office Action dated Aug. 29, 2019 for Application No. 201717030332.
Non-English Chinese Office Action dated Oct. 8, 2019 for Application No. 201680017622.2.

* cited by examiner

METHOD AND APPARATUS FOR CHARGING OR DISCHARGING AN ENERGY STORE

CROSS-REFERENCE TO RELATED APPLICATIONS

This application claims priority to PCT Application No. PCT/EP2016/055574, having a filing date of Mar. 15, 2016, based off of German application No. 10 2015 205171.4 having a filing date of Mar. 23, 2015, the entire contents both of which are hereby incorporated by reference.

FIELD OF TECHNOLOGY

The following relates to a method and an apparatus for charging or discharging an electrochemical energy store, the aging behavior of which is modeled by a description of its depth of discharge (DoD). The following furthermore relates to an electrical system and to a computer program product.

BACKGROUND

To determine the economical use of an electrochemical energy store in an energy system, the operation-dependent aging of the energy store must be taken into consideration. The so-called use-dependent lifetime loss of a lithium-ion battery can be modeled by the following formula $$\Delta SOH_{cycle,rel} = f(DoD) \cdot f(T) \cdot f(I) \cdot \Delta Q \quad (1).$$

In this formula, f(DoD) is a non-linear factor that is dependent on the depth of discharge, f(T) is a non-linear factor that is dependent on the temperature that the battery cells exhibits, f(I) is a non-linear factor that is dependent on current, and ΔQ represents the charge throughput through the battery. The so-called state of health (SOH) represents the state of health of the battery and describes to what extent the measure of battery aging has already advanced. Aging of the SOH results in capacitive and/or resistive aging of the battery, as a result of which the performance of the battery is lowered. Ultimately, the battery needs to be replaced at some time.

The above-mentioned factors are determinable for different battery chemistries in similar ways. In formula (1), f(T) and ΔQ are considered to be known. The temperature-dependent non-linear factor f(T) is known from examinations of different battery types (i.e. battery chemistries) carried out in the past. The temperature-dependent factor f(T) is given by Arrhenius' law:

$$f(T) = \exp\frac{-E_a}{RT}, \quad (2)$$

in which $E_a$ and R are known parameters, and T is the temperature in Kelvin.

The charge throughput ΔQ is a variable that is given by the battery operation and is metrologically determinable.

The current-dependent factor f(I) can be determined from aging experiments. A small factor for discharge currents and small charge currents and a large factor for large charge currents is typical.

The factor f(DoD) is likewise determined from aging experiments. The aging differs in dependence on stroke of the state of charge (SOC). The greater the SOC stroke, i.e. the depth of discharge, the greater the factor f(DoD). Generally, a factor f(DoD) which increases monotonously with the depth of discharge is typical.

In the experiments that are to be carried out in order to determine the factors, the energy store is cyclically charged and discharged with a constant SOC stroke, as is illustrated by way of example in FIG. 1. FIG. 1 shows the profile of the state of charge SOC over time t. The state of charge SOC is 100% if the energy store is fully charged. The state of charge SOC is 0% if no more charge can be drawn from the energy store, i.e. the energy store is empty. The time t in the present exemplary embodiment is plotted normalized from 0 to 100. The profile of the state of charge in FIG. 1 is such that, starting from an SOC1, which is approximately 90%, the charging store is discharged to an SOC value of approximately 30% with a constant current. Next, a constant, yet different current is used to effect charging from SOC2 to SOC1. The process subsequently repeats itself several times. The difference between SOC2 and SOC1 is the SOC stroke or the DoD value (DoD=SOC1−SOC2), as is illustrated by way of the arrow DoD in FIG. 1.

One disadvantage of using cyclic discharging and charging of the energy store, illustrated in FIG. 1, is that it is not possible to determine from these experiments what influence the exact form of the SOC profile has on aging. In particular, it is not possible to determine whether the description of the DoD with respect to the observed battery chemistry is correct.

For this reason, the so-called "rainflow algorithm" is alternatively used to calculate the DoD value. Here, an SOC profile as shown in FIG. 2 is interpreted as different, interleaved partial cycles having a different stroke. The use of the rainflow algorithm is a good approximation for many battery chemistries. For some battery chemistries, the rainflow algorithm is an inaccurate method for determining the DoD and thus results in a false model of aging. This consequently leads to incorrectly derived charging strategies.

Since the DoD according to formula (1) has an influence on the aging of an energy store, the correct description of the DoD is necessary for correct modeling of the aging behavior.

SUMMARY

An aspect relates to a method and an apparatus with which it is possible in a more precise manner to charge or discharge an electrochemical energy store, the aging behavior of which is modeled by a specific description of its depth of discharge. A further aspect is to specify a corresponding computer program product.

Proposed is a method for charging or discharging an electrochemical energy store, the aging behavior of which is modeled by describing its depth of discharge, at which a depth-of-discharge value is associated with each time period between two adjacent local maxima and minima in a time-dependent state-of-charge profile, which depth-of-discharge value corresponds to the charging or discharging stroke between the state-of-charge values of the two adjacent local maxima and minima.

The local maximum and minimum of the time-dependent state-of-charge profile are also considered to be points at which the charging or discharging current has the value 0 for a short time, i.e. for a short period of time. This type of modeling the depth of discharge (also referred to as DoD modeling below) means that a large discharging process is interrupted by brief stopping or brief charging, and is divided into two small partial cycles. The depth of discharge (DoD) of this discharging process is thus reduced to smaller values which are given by the SOC stroke before and after the interruption. The same is true of a charging operation which is interrupted by brief stopping or short-term discharging, and is divided into two small partial cycles.

The described modeling is not suitable for all types of battery chemistries. However, it has been found that such a DoD behavior is precise in lithium-ion batteries, in particular lithium-titanate batteries.

In the method according to embodiments of the invention, the energy store is transitioned from a first state of charge at a first time to a second state of charge at a second time by way of the charging or discharging process being interrupted at least once within the time period formed between the first and the second time to form respective charging or discharging subblocks with a respective charging or discharging stroke, wherein a respective charging or discharging stroke is smaller than the total stroke between the first and the second state of charge.

Compared to uninterrupted complete charging or discharging from the first state of charge to the second state of charge, shorter charging or discharging subblocks having a respective (smaller) charging stroke are obtained with this method. With this method, battery aging can be significantly reduced compared to constant charging without interruption from the first state of charge to the second state of charge. Since battery aging results in reduced capacity and increased internal resistance, the proposed method increases the lifetime of the battery. At the same time, the efficiency of the battery is improved owing to the comparatively low increase of internal resistance.

Interruption between two charging or discharging subblocks can comprise a charging or discharging current having the value 0. In order to thus divide a charging or discharging process into at least two charging or discharging subblocks, it is sufficient if the charging or discharging process is interrupted for a specific time. The interruption thus means that the charging or discharging current comprises the value 0.

An interruption between two charging subblocks can comprise a discharging section. Alternatively, an interruption between two discharging subblocks can comprise a charging section. With these configuration variants, energy stores are taken into consideration that have such battery chemistries in which an interruption where the charging or discharging current has the value 0 is not sufficient to be "recognized" as an interruption. However, such energy stores are also able to "recognize" the interruption in the manner according to embodiments of the invention, because a charging or discharging current with an opposite sign to the preceding charging and discharging process is used.

In accordance with a further configuration, charging or discharging the energy store can be interrupted at regular intervals. This results in the charging or discharging subblocks having identical lengths. Alternatively, the charging or discharging of the energy store can also be interrupted at irregular intervals.

Provision may furthermore be made for the time period of the interruptions to be of equal length. The time periods of the interruptions can alternatively also have different lengths.

In accordance with a further configuration, charging or discharging the energy store can be effected in the charging or discharging subblocks at least in sections with a constant current. That means the charging or discharging current has the same absolute value within a charging or discharging subblock. Alternatively, a plurality of sections with different charging or discharging currents can be provided within a charging or discharging subblock. Provision can also be made for the charging or discharging current that is used for one discharging subblock to also be used in at least one other or even all other charging or discharging subblocks. Which of the variants mentioned is best depends not only on the extent of the charging stroke between the first and the second state of charge, but also on the battery chemistry of the relevant energy store.

In accordance with a further expedient configuration, the magnitude of the charging current for each charging or discharging subblock can be adapted in dependence on the length of the previous interruption, with the result that it is ensured that the second state of charge is reached at the second time.

Furthermore, a computer program product is proposed, which can be loaded directly into the internal memory of a digital computer for controlling the charging and/or discharging of the electrochemical energy store and which comprises software code sections with which the steps of the above-described method are carried out when the product runs on the computer.

In accordance with a further aspect of the invention, an apparatus (702 of FIG. 7) for charging or discharging an electrochemical energy store is proposed, the aging behavior of which is modeled by describing its depth of discharge, at which a depth-of-discharge value is associated with each time period between two adjacent local maxima and minima in a time-dependent state-of-charge profile, which depth-of-discharge value corresponds to the charging or discharging stroke between the state-of-charge values of the two adjacent local maxima and minima. The apparatus (701-704 of FIG. 7) is configured to transition the energy store from a first state of charge at a first time to a second state of charge at a second time, in which the charging or discharging process is interrupted at least once within the time period formed between the first and the second time to form respective charging or discharging subblocks with a respective charging or discharging stroke, wherein a respective charging or discharging stroke is smaller than the total stroke between the first and the second state of charge.

The apparatus can comprise further means for carrying out the method.

The apparatus has the same advantages as have been described previously in connection with the method according to embodiments of the invention.

Embodiments of the invention finally propose an electrical system that comprises an apparatus of the above-mentioned type and an energy store, wherein the energy store is a lithium-titanate battery or an energy store having a comparable battery chemistry. The energy store can be for example a traction battery of an electrically operated vehicle or of a hybrid vehicle, which not only has an electrical drive but also an internal combustion engine drive. The energy store can also be used in a self-sufficient energy supply system, e.g. for intermediate storage of regeneratively generated energy. Such an energy supply system can also have a connection to a conventional composite energy supply system.

BRIEF DESCRIPTION

Some of the embodiments will be described in detail, with reference to the following figures, wherein like designations denote like members, wherein:

FIG. 1 shows an already described cyclic charging and state-of-discharge profile of an electrochemical energy store, FIG. 2 shows an already described charging curve of an electrochemical energy store for use of the known "rainflow algorithm" for ascertaining a depth-of-discharge value, FIG. 3 shows the charging curve known from FIG. 2, by way of which a description of its depth of discharge, used in accordance with embodiments of the invention, is explained, FIG. 4 shows a state-of-charge profile, proposed in accordance with embodiments of the invention, during charging of an electrochemical energy store, the aging behavior of which is able to be modeled by describing its depth of discharge according to embodiments of the invention, and FIG. 5 shows a state-of-discharge profile, proposed in accordance with embodiments of the invention, during discharging of an electrochemical energy store, the aging behavior of which is able to be modeled by describing its depth of discharge in accordance with embodiments of the invention.

DETAILED DESCRIPTION

Figure 1:
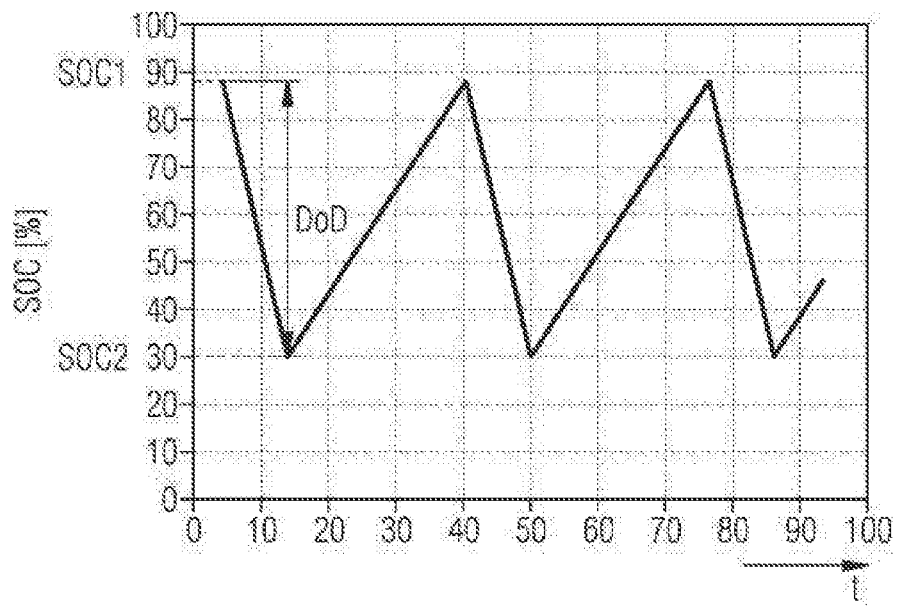
Figure 2:
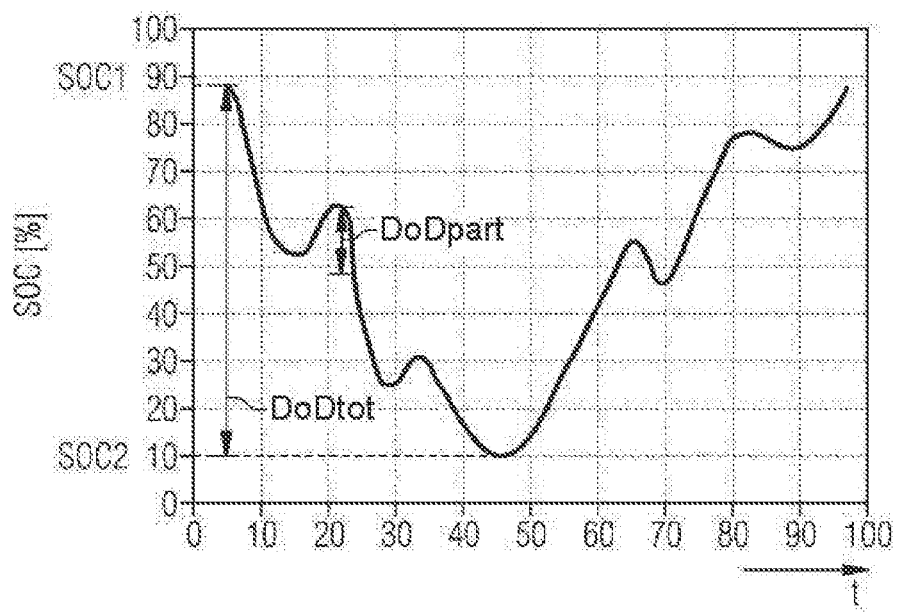
Figure 3:
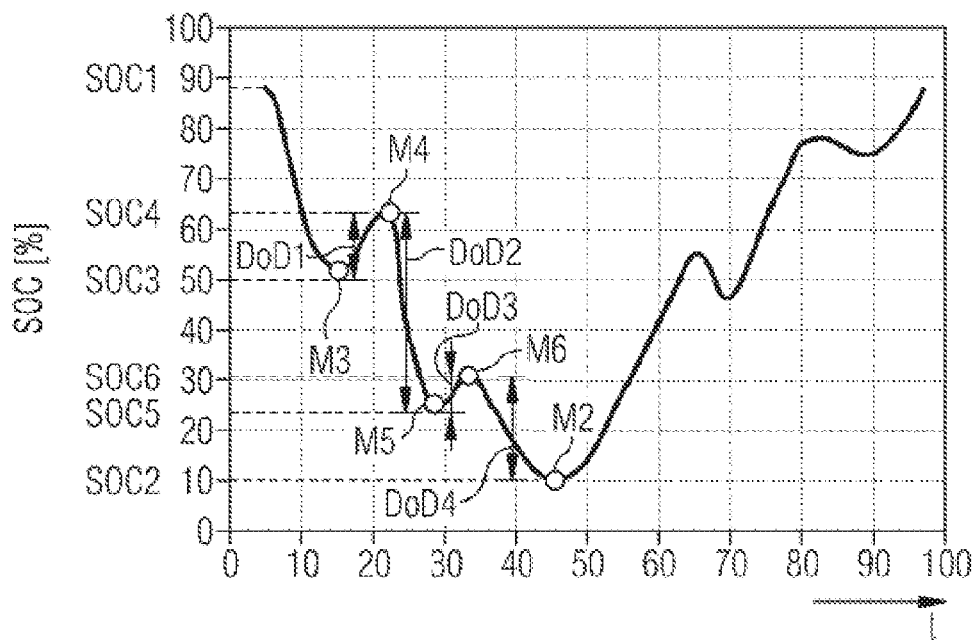

FIG. 3 shows an exemplary, time-dependent state-of-charge profile. The normalized time t from 0 to 100 is plotted on the x-axis. The state of charge (SOC) is plotted in percent from 0 to 100 on the y-axis. Here, an SOC value of 100% corresponds to a fully charged energy store, while an SOC value of 0% corresponds to a completely empty energy store.

In the exemplary state-of-charge profile shown in FIG. 3, the curve starts at an SOC value SOC1 of approximately 90%, and is initially discharged to an SOC value SOC3 of approximately 50%. Then follows a charging process to an SOC value SOC4 of approximately 65%. This is followed by a discharging process to an SOC value SOC5 of approximately 25%, which increases to an SOC value SOC6 of approximately 30%, until finally a discharge to the SOC value SOC2 of approximately 10% takes place. Subsequently, a charging process to the SOC value SOC1 takes place, wherein the charging process is interrupted by two temporary discharging processes (not shown in more detail in the Figure).

The DoD value associated with this exemplary state-of-charge profile is determined by initially determining the local maxima and minima of the state-of-charge curve. In the state-of-charge curve shown, local minima M3, M5 and M2, and local maxima M4 and M6 are thus marked in particular. The local minima M3, M5 and M2 are associated with the SOC values SOC3, SOC5 and SOC2. The local maxima M4 and M6 are associated with the SOC values SOC4 and SOC6.

It should be noted that also considered to be local maxima and minima are such points on a state-of-charge curve at which the charging current takes the value 0 for a previously defined time. In the state-of-charge profile shown in FIG. 3, however, no such "plateaus" at which the charging or discharging current assumes the value 0 for a specific time are shown.

In a next step, a DoD value, which corresponds to the charging stroke between the SOC values that are associated with the local maxima and minima, is associated for each time period between two points of reversal, i.e. a local maximum and the adjacent local minimum. The corresponding DoD values between two points of reversal are shown by way of example with arrows. Here, the corresponding charging stroke between the local minimum M3 and the local maximum M4 corresponds to the DoD value DoD1, which is obtained from the absolute value of the difference of the SOC values SOC4–SOC3. In a similar way, a charging stroke DoD2 between the local maximum M4 and the local minimum M5 was ascertained, which is obtained from the absolute value of the difference of the SOC values SOC4–SOC5. Analogously, a DoD value DoD3 between the local minimum M5 and the local maximum M6 is obtained from the absolute value of the difference of the SOC values SOC6–SOC5. Finally, the DoD value DoD4 between the local maximum M6 and the local minimum M2 was ascertained, the stroke of which is obtained from the absolute value of the difference of the SOC values SOC6–SOC2. For the sake of simplicity, the corresponding DoD values for the further local maxima and minima contained in the charging curve were not plotted.

Since the described procedure is a continuous calculation method, no initial point has been associated with the SOC value SOC1 for the sake of simplicity. However, this is also possible in principle.

This type of DoD modeling means that the mere discharging process from the state-of-charge value SOC1 to the state-of-charge value SOC2 is interrupted once or a plurality of times by stopping or by a charging or discharging process in the opposite direction, and is divided into a plurality of small partial cycles. The DoD of the discharging process from the state-of-charge value SOC1 to the state-of-charge value SOC2 is thus reduced to the smaller values between the adjacent local maxima and minima (points of reversal), which are given by the charging stroke before and the charging stroke after the interruption.

Such modeling applies in particular to lithium-ion batteries, and here in particular to lithium-titanate batteries.

Starting from the above-described modeling, the exemplary charging and discharging strategies which are described below are obtained, which increase the lifetime of the battery and improve the efficiency of the battery over time as compared to charging and discharging strategies that are based, for example, on modeling of the DoD in accordance with the rainflow algorithm.

Figure 4:
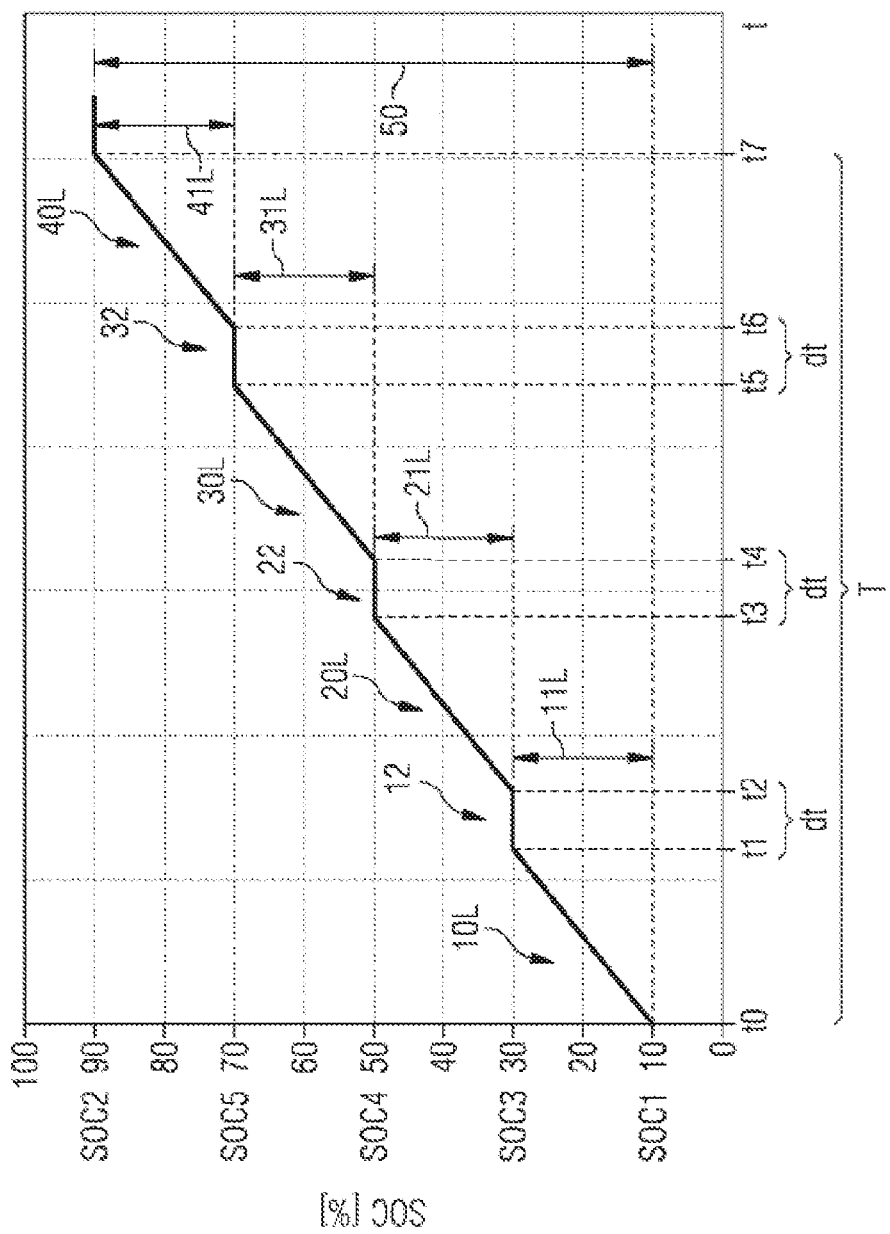
Figure 6:
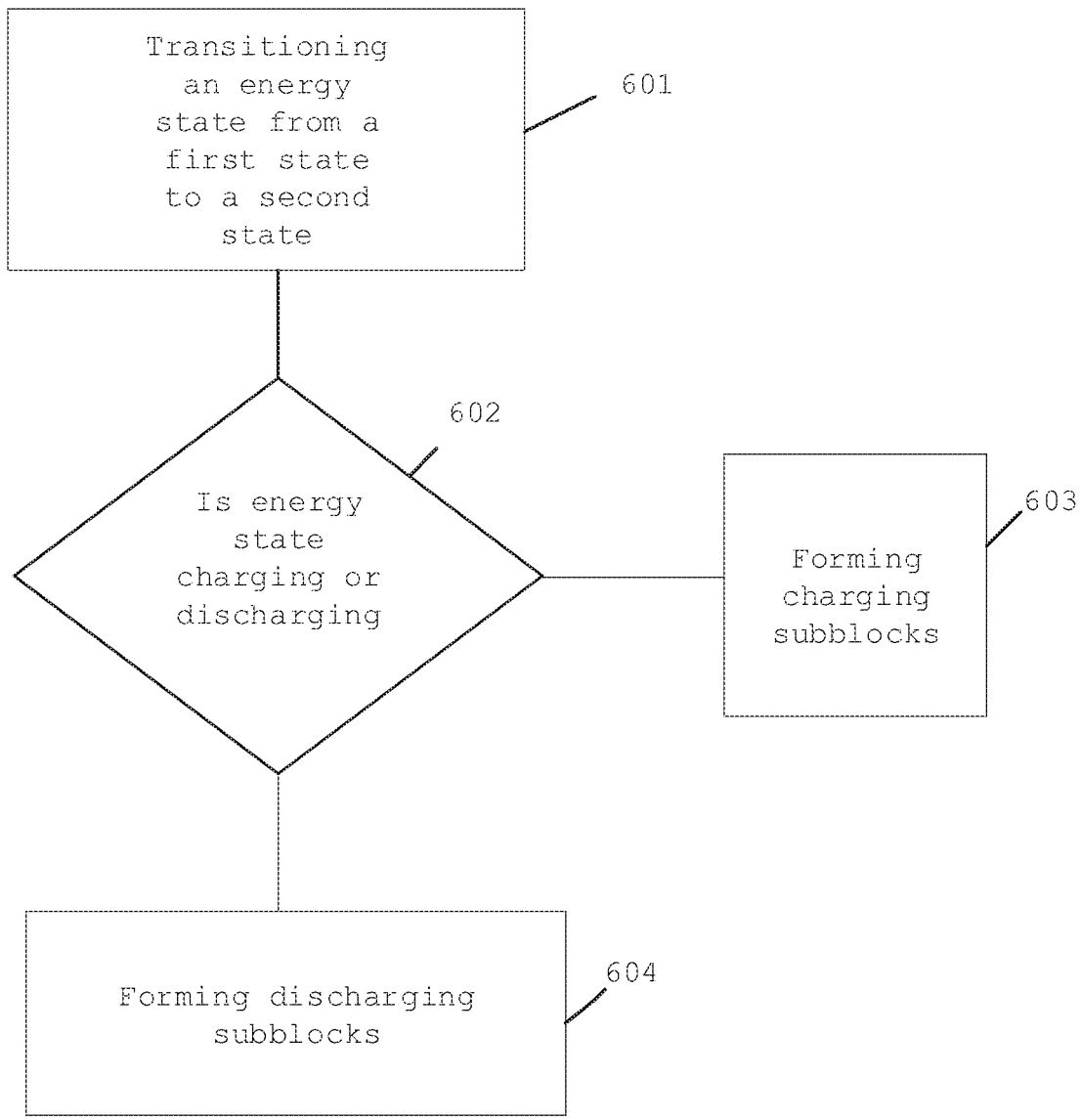
FIG. 6 is a flowchart of the method for charging or discharging.
Figure 7:
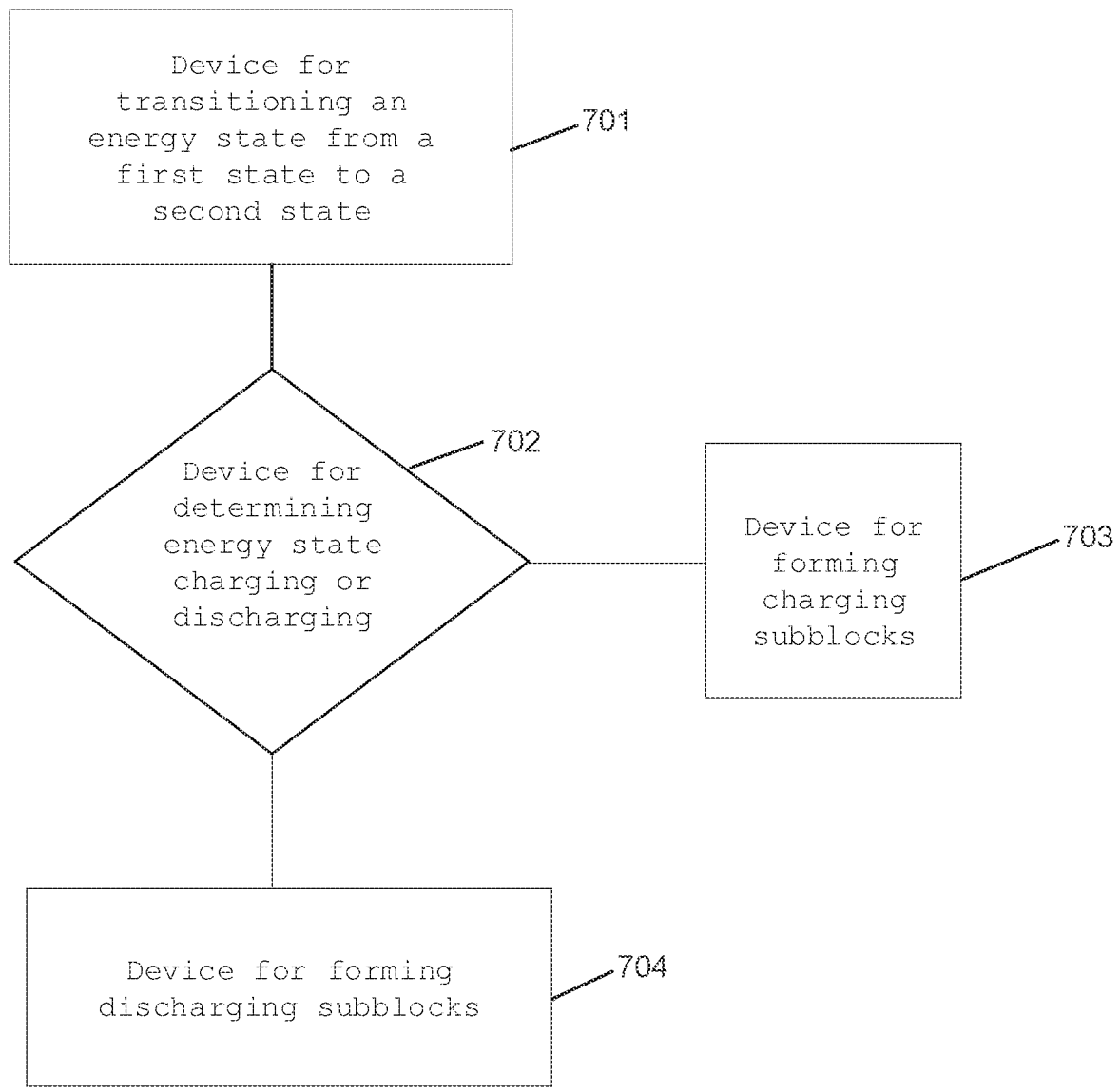
FIG. 7 is a device for charging or discharging.

FIG. 4 shows a state-of-charge curve in accordance with the method (FIG. 6) on which embodiments of the invention is based. In order to transition the energy store (step 601 of FIG. 6) at time t0 from the state of charge SOC1 to the state of charge SOC2 at time t7, charging with a constant current is carried out, wherein this charging process is interrupted at regular intervals for a particular short time period dt. The charging current is obtained by $$I = \frac{Cap * (SOC2 - SOC1)}{100 * (T - dt * n)}. \tag{3}$$

Here, SOC1 is the state of charge at time t0, SOC2 is the state of charge at time t7, Cap is the capacity of the energy store in ampere hours, T is the time period between t7 and t1 (T=t7−t1), dt is the time period of the interruption of the charging process, and n is the number of interruptions.

As a result of this charging method (step 602 of FIG. 6), a number of charging subblocks are obtained (step 603 of FIG. 6) with a respective charging stroke $$\frac{(SOC2 - SOC1)}{n}. \tag{4}$$

In the exemplary embodiment shown in FIG. 4, the SOC value SOC1=10% at time t0. At time t7, the SOC value SOC2=90% is intended to be reached. By way of example, the charging process comprises four charging subblocks 10L, 20L, 30L, 40L. Shown between two adjacent charging subblocks 10L, 20L, and 20L, 30L, and 30L, 40L are the already mentioned interruptions 12, 22, 32 having the length dt, during which the charging current I=0. The charging stroke DoD is the same owing to the constant charging current I in all charging subblocks 10L, 20L, 30L, 40L and the respective constant charging periods. In FIG. 4, this is marked by the reference signs 11L for the charging subblock 10L, 21L for the charging subblock 20L, 31L for the charging subblock 30L, and 41L for the charging subblock 40L. Overall, a charging stroke of SOC2−SOC1 is obtained, wherein the entire charging stroke is marked with the reference sign 50.

Figure 5:
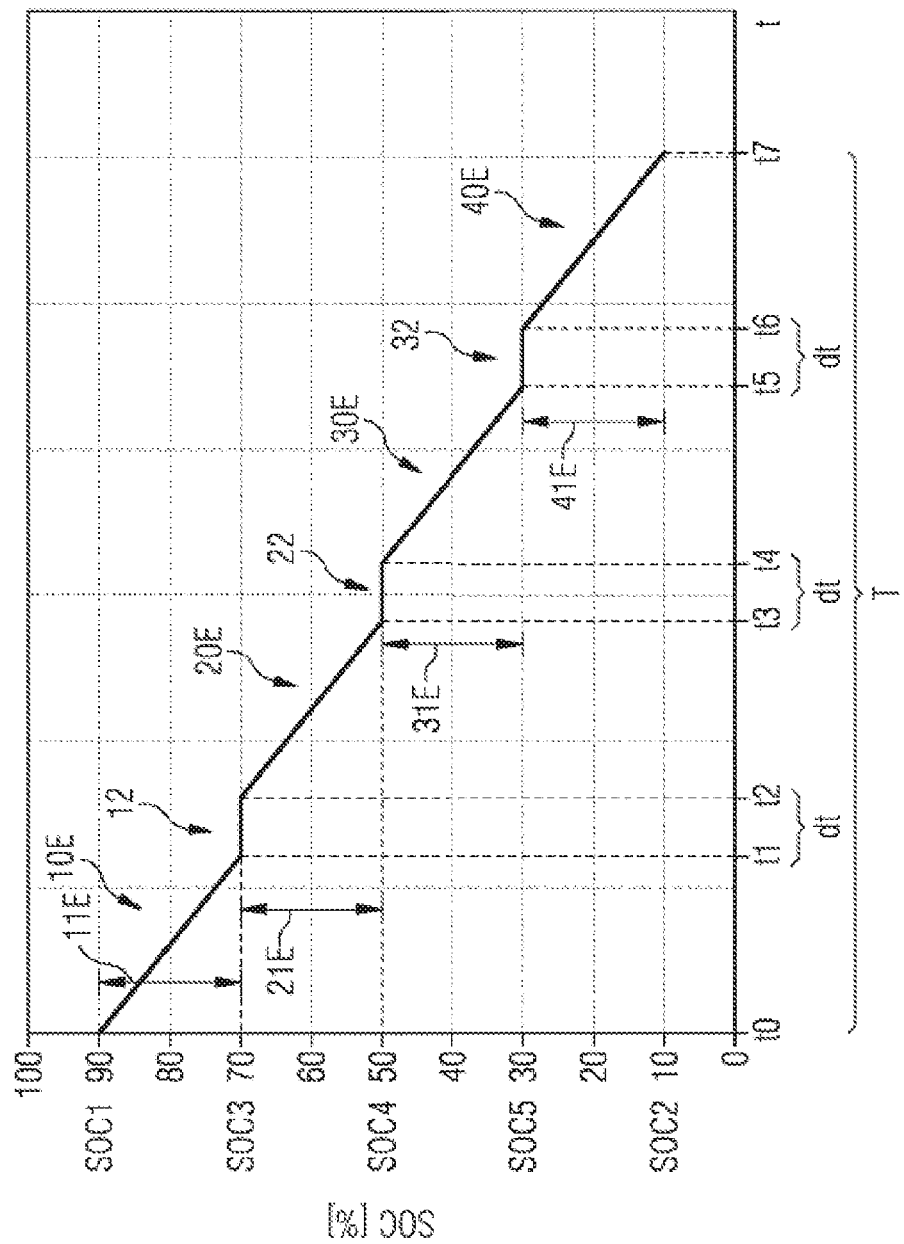

Similarly, FIG. 5 shows a state-of-discharge curve in accordance with which a discharge (step 602 of FIG. 6) of the SOC value SOC2 at time t7 is intended to be reached starting from an SOC value SOC1=90% at time t0. Analogously with the preceding exemplary embodiment, the discharging process is divided (step 604 of FIG. 6), merely by way of example, into four discharging subblocks 10E, 20E, 30E, 40E of equal lengths, wherein respective interruptions 12, 22, 32 are provided between two discharging subblocks 10E, 20E, and 20F, 30E, and 30E, 40E, during which the discharging current I=0. Merely by way of example, the interruptions 12, 22, 32 are here also of equal time period dt. Owing to the constant discharging current in each discharging subblock 10E, 20E, 30E, 40E (which results from the constant negative increase of the respective sections) and the interruptions 12, 22, 32, which are in each case of equal length, a discharging stroke 11E, 21E, 31E, 41E of the same magnitude is obtained for each discharging subblock 10E, 20E, 30E, 40E.

In principle, the charging breaks or interruptions 12, 22, 32 during a charging process should be as short as possible in order to keep the required charging current low in order to reach the second state of charge SOC2 from the first state of charge SOC1 within the time period T. The longer the selected interruptions 12, 22, 32 are, the greater the charging current required in the charging subblocks becomes, i.e. the steeper the sections of the charging subblocks 10L, 20L, 30L, 40L are. Associated damage to the energy store during charging can thus also be avoided.

In principle, the magnitude of the charging current is obtained in dependence on the boundary condition that the state of charge SOC2 to be reached must be reached within the time period T. Another boundary condition is the battery chemistry of the energy store that permits a maximum charging current without being negatively influenced in the process.

In contrast, longer interruptions and correspondingly greater discharging currents are also acceptable during a discharging process.

Although the exemplary embodiments in accordance with FIGS. 4 and 5 illustrate charging and discharging subblocks 10L, ..., 40L and 10E, ..., 40E of equal lengths, it is possible for the charging and discharging subblocks to have an individually different length with an individually different charging or discharging current. The length dt of the interruptions 12, 22, 32 between respective charging and discharging subblocks can likewise be selected to be of different length. It is furthermore also possible for the charging and discharging currents to be selected individually for each charging and discharging subblock during a charging process or a discharging process. It is even possible to vary the charging and discharging currents within one charging and discharging subblock. The variation takes place with the boundary condition that charging or discharging from the first state of charge SOC1 to the second state of charge SOC2 is possible within the time period T.

In the case of regular interruptions, the interruption interval dt, i.e. the time period between t3 and t1, and t5 and t3, and t7 and t5 should be chosen such that the resulting DoD value sufficiently reduces the aging in contrast to an uninterrupted charging process. In addition, the interval dt should not be selected to be so small that the charging current as a result becomes unnecessarily large with a fixed time duration dt of the interruptions 12, 22, 32, and remains within specified limits.

The battery aging in a first approximation changes on account of the proposed charging strategy by the factor $$\frac{fDoD\left((SOC2-SOC1)\frac{1}{n}\right)}{fDoD(SOC2-SOC1)}. \tag{5}$$

This factor is typically less than 1, which means that the energy store ages less, because the DoD-dependent aging for small DoD values is typically less than for large DoD values. If a desired reduction in aging is specified for an application or is obtained by way of an optimization calculation, the interruption interval can be calculated by way of this factor, possibly taking into consideration a specified limit of the charging or discharging current.

If properties of the battery chemistry of the energy store necessitate a short counter-charging process in order to terminate a charging or discharging subblock, then the interruption can also be replaced by such a charging process. A counter-charging process is understood to mean, for example, a brief charging process when a discharging process is carried out. In the case of a charging process, a brief discharging process is carried out in the interruption. The strength of the current during counter-charging must be adapted such that the stroke SOC2−SOC1 is still reached after the time period T.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for charging or discharging an electrochemical energy store, an aging behavior of which is modeled by describing its depth of discharge (DoD), at which a depth-of-discharge value is associated with each time period between two adjacent local maxima and minima in a time-dependent state-of-charge profile, which the depth-of-discharge value corresponds to a charging or discharging stroke between a state-of-charge values of the two adjacent local maxima and minima, wherein transitioning the energy store from a first state of charge (SOC1) at a first time (t0) to a second state of charge (SOC2) at a second time (t7) by way of a charging or discharging process being interrupted at least once within a time period (T) formed between the first and the second time (t0, t7) forming a respective charging or discharging subblocks with the respective charging or discharging stroke, wherein the respective charging or discharging stroke is smaller than a total stroke between the first and the second state of charge, wherein an interruption between two charging or discharging subblocks comprises a charging or discharging current having a value 0, and wherein a magnitude of the charging current for each charging or discharging subblock is adapted in dependence on a length of the previous interruption, with a result that it is ensured that the second state of charge is reached at the second time.

2. The method as claimed in claim 1, wherein an interruption between two charging subblocks comprises a discharging section.

3. The method as claimed in claim 1, wherein an interruption between two discharging subblocks comprises a charging section.

4. The method as claimed in claim 1, wherein the charging or discharging of the energy store is interrupted at regular intervals.

5. The method as claimed in claim 1, wherein the charging or discharging of the energy store is interrupted at irregular intervals.

6. The method as claimed in claim 1, wherein the time periods of the interruptions are the same.

7. The method as claimed in claim 1, wherein the time periods of the interruptions differ.

8. The method as claimed in claim 1, wherein the charging or discharging of the energy store in the charging or discharging subblocks is effected at least in sections with a constant current.

9. A computer program product, comprising a computer readable hardware storage device having a computer readable program code stored therein, said program code executable by a processor of a computer system to implement a method, which can be loaded directly into the internal memory of a digital computer for controlling the charging and/or discharging of the electrochemical energy store and which comprises software code sections with which the steps as claimed in claim 1 are carried out when the computer program product runs on the computer.

10. An apparatus for charging or discharging an electrochemical energy store, an aging behavior of which is modeled by describing its depth of discharge (DoD), at which a depth-of-discharge value is associated with each time period between two adjacent local maxima and minima in a time-dependent state-of-charge profile, which the depth-of-discharge value corresponds to a charging or discharging stroke between a state-of-charge values of the two adjacent local maxima and minima, wherein the apparatus is configured for transitioning the energy store from a first state of charge (SOC1) at a first time (t0) to a second state of charge (SOC2) at a second time (t7) by way of a charging or discharging process being interrupted at least once within a time period (T) formed between the first and the second time (t0, t7) to form a respective charging or discharging subblocks with the respective charging or discharging stroke, wherein the respective charging or discharging stroke is smaller than the total stroke between the first and the second state of charge, wherein an interruption between two charging or discharging subblocks comprises a charging or discharging current having a value 0, and wherein a magnitude of the charging current for each charging or discharging subblock is adapted in dependence on a length of the previous interruption, with a result that it is ensured that the second state of charge is reached at the second time.

11. The apparatus as claimed in claim 10, which comprises further means for performing the method.

12. An electrical system, comprising the apparatus as claimed in claim 10 and the energy store, wherein the energy store is a lithium-titanate battery or an energy store having a comparable battery chemistry.

* * * * *